(12) United States Patent
Leung

(10) Patent No.: US 7,275,200 B2
(45) Date of Patent: Sep. 25, 2007

(54) TRANSPARENT ERROR CORRECTING MEMORY THAT SUPPORTS PARTIAL-WORD WRITE

(75) Inventor: Wingyu Leung, Cupertino, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/221,098

(22) Filed: Sep. 6, 2005

(65) Prior Publication Data
US 2006/0112321 A1    May 25, 2006

Related U.S. Application Data

(63) Continuation-in-part of application No. 10/997,604, filed on Nov. 23, 2004.

(51) Int. Cl.
*G11C 29/00* (2006.01)

(52) U.S. Cl. ..................... 714/763; 714/773
(58) Field of Classification Search ............... 714/764, 714/773, 763
See application file for complete search history.

(56) References Cited

U.S. PATENT DOCUMENTS

| | | | |
|---|---|---|---|
| 3,814,921 A * | 6/1974 | Nibby et al. ............ 714/764 |
| 3,969,706 A * | 7/1976 | Proebsting et al. .... 365/189.02 |
| 4,045,783 A * | 8/1977 | Harland ................. 365/202 |
| 4,317,201 A | 2/1982 | Sedalis |
| 4,345,328 A | 8/1982 | White |
| 4,380,812 A | 4/1983 | Ziegler, II et al. |
| 4,389,714 A * | 6/1983 | Nakao ................... 365/207 |
| 4,561,095 A | 12/1985 | Khan |
| 4,694,454 A | 9/1987 | Matsuura |
| 4,706,248 A | 11/1987 | Masaki |
| 4,726,021 A | 2/1988 | Horiguchi et al. |
| 4,740,968 A | 4/1988 | Aichelmann, Jr. |

(Continued)

FOREIGN PATENT DOCUMENTS

GB    2289779    11/1995

(Continued)

OTHER PUBLICATIONS

Intel Corp., Pentium Processor 3.3V Pipelined BSRAM Specification, Ver. 2.0, May 25, 1995, pp. 1-44.

(Continued)

*Primary Examiner*—Stephen M. Baker
(74) *Attorney, Agent, or Firm*—Bever, Hoffman & Harms, LLP; E. Eric Hoffman

(57) ABSTRACT

A high-speed partial-word write operation is performed in a memory system. First, an error correction code (ECC) word, which includes a data word and associated error correction bits, is read from a memory array. A word line and a plurality of sense amplifiers are enabled during this read operation. The read data word is corrected in response to the associated error correction bits, thereby creating a corrected data word. The corrected data word is merged with a write data word, thereby creating a merged write data word. Write error correction bits are generated in response to the merged write data word, and the merged write data word and write error correction bits are written to the memory array. The word line and the plurality of sense amplifiers remain enabled from the reading operation through the write operation, thereby speeding up the partial-word write operation.

13 Claims, 8 Drawing Sheets

U.S. PATENT DOCUMENTS

| | | | |
|---|---|---|---|
| 4,768,197 A * | 8/1988 | Petolino et al. | 714/754 |
| 4,782,487 A | 11/1988 | Smelser | |
| 4,794,597 A | 12/1988 | Ooba et al. | |
| 4,839,868 A * | 6/1989 | Sato et al. | 365/230.06 |
| 4,884,271 A * | 11/1989 | Concha et al. | 714/764 |
| 4,933,904 A * | 6/1990 | Stewart et al. | 365/185.02 |
| 4,939,694 A | 7/1990 | Eaton et al. | |
| 5,003,542 A | 3/1991 | Mashiko et al. | |
| 5,008,886 A * | 4/1991 | Chinnaswamy et al. | 714/764 |
| 5,151,906 A | 9/1992 | Sawada | |
| 5,177,743 A | 1/1993 | Shinoda et al. | |
| 5,233,616 A | 8/1993 | Callander | |
| 5,235,693 A * | 8/1993 | Chinnaswamy et al. | 711/159 |
| 5,241,503 A * | 8/1993 | Cheng | 365/205 |
| 5,274,646 A | 12/1993 | Brey et al. | |
| 5,289,584 A | 2/1994 | Thome et al. | |
| 5,369,651 A | 11/1994 | Marisetty | |
| 5,402,389 A | 3/1995 | Flannagan et al. | |
| 5,430,742 A * | 7/1995 | Jeddeloh et al. | 714/764 |
| 5,434,868 A | 7/1995 | Aichelmann, Jr. et al. | |
| 5,469,558 A | 11/1995 | Lieberman et al. | |
| 5,502,835 A | 3/1996 | Le et al. | |
| 5,513,148 A | 4/1996 | Zagar | |
| 5,519,839 A | 5/1996 | Culley et al. | |
| 5,519,847 A | 5/1996 | Fandrich et al. | |
| 5,524,220 A | 6/1996 | Verma et al. | |
| 5,533,194 A | 7/1996 | Albin et al. | |
| 5,535,226 A | 7/1996 | Drake et al. | |
| 5,579,267 A | 11/1996 | Koshikawa | |
| 5,586,282 A | 12/1996 | Iino et al. | |
| 5,592,435 A | 1/1997 | Mills et al. | |
| 5,615,169 A | 3/1997 | Leung | |
| 5,638,385 A | 6/1997 | Fifield et al. | |
| 5,671,187 A * | 9/1997 | Childers et al. | 365/205 |
| 5,687,353 A * | 11/1997 | Chen et al. | 711/155 |
| 5,708,624 A | 1/1998 | Leung | |
| 5,778,237 A | 7/1998 | Yamamoto et al. | |
| 5,829,026 A | 10/1998 | Leung et al. | |
| 5,933,436 A | 8/1999 | Tanzawa et al. | |
| 5,961,655 A | 10/1999 | Johnson et al. | |
| 6,020,773 A | 2/2000 | Kan et al. | |
| 6,052,011 A | 4/2000 | Dasgupta | |
| 6,052,816 A | 4/2000 | Yoshinogawa | |
| 6,065,146 A | 5/2000 | Bosshart | |
| 6,101,614 A | 8/2000 | Gonzales et al. | |
| 6,147,535 A | 11/2000 | Leung | |
| 6,374,381 B1 | 4/2002 | Moriya | |
| 6,549,460 B2 | 4/2003 | Nozoe et al. | |
| 6,563,745 B1 | 5/2003 | Ilkbahar | |
| 6,697,992 B2 | 2/2004 | Ito et al. | |
| 6,701,480 B1 * | 3/2004 | Karpuszka et al. | 714/764 |
| 6,738,883 B2 * | 5/2004 | March et al. | 711/171 |
| 6,781,898 B2 | 8/2004 | Kim et al. | |
| 6,799,287 B1 | 9/2004 | Sharma et al. | |
| 6,854,059 B2 * | 2/2005 | Gardner | 713/171 |
| 7,064,993 B2 * | 6/2006 | Gyohten et al. | 365/205 |
| 7,099,216 B2 * | 8/2006 | Luk et al. | 365/205 |
| 2002/0029365 A1 | 3/2002 | Sato et al. | |
| 2004/0039883 A1 * | 2/2004 | LaBerge et al. | 711/155 |
| 2004/0044943 A1 * | 3/2004 | Jacquet et al. | 714/763 |
| 2004/0064646 A1 * | 4/2004 | Emerson et al. | 711/131 |
| 2004/0172504 A1 * | 9/2004 | Balazich et al. | 711/118 |
| 2004/0213064 A1 * | 10/2004 | Gyohten et al. | 365/205 |
| 2005/0185492 A1 * | 8/2005 | Harrand | 365/230.05 |
| 2006/0034132 A1 * | 2/2006 | Jain | 365/189.05 |
| 2006/0080589 A1 * | 4/2006 | Holm et al. | 714/763 |
| 2006/0156196 A1 * | 7/2006 | Takahashi et al. | 714/766 |
| 2006/0158950 A1 * | 7/2006 | Klein | 365/222 |
| 2006/0200723 A1 * | 9/2006 | Carnevale et al. | 714/758 |
| 2006/0200728 A1 * | 9/2006 | Nagai et al. | 714/763 |

FOREIGN PATENT DOCUMENTS

JP 55055499 4/1980

OTHER PUBLICATIONS

Hegde, Anupama "Error Detection and Correction with the IDT49C466", Microprocessors & Microsystems, vol. 18, No. 10, Dec. 1994, pp. 613-620.

IBM Corp. "Error Correction Circuit for Dynamic Random Access Memories", vol. 36, No. 8, Aug. 1983, pp. 681-682.

Jarwala et al. "Cost Analysis of On Chip Error Control for Fault Tolerant Dynamic RAMs", 1987 IEEE, pp. 278-283.

Sunaga et al. "A Full bit Prefetch Architecture for Synchronous DRAMSs", IEEE Journal of Solid-State Circuits, vol. 30, No. 9, Sep. 1995, pp. 998-1005.

Hsiao, M.Y. "A Class of Optimal Minimum Odd-weight-column SEC-DED Codes", Jul. 1970, pp. 395-401.

IDT, Inc. "A 16-Bit CMOS Error Detection & Correction Unit", Apr. 1990, pp. 1-19.

Dosaka et al. "A 100-MHz 4-Mb Cache DRAM with Fast Copy-Back Scheme", IEEE Journal of Solid-State Circuits, vol. 27, No. 11, Nov. 1992, pp. 1534-1539.

Bondurant, D. "15nsec Enhanced DRAM Upgrades System Performance in 72-Pin SIMM Socket", Silicon Valley Personal Computer Design Conference Proceedings (date of Publication unknown), pp. 81-86.

* cited by examiner

TRANSPARENT ERROR CORRECTING MEMORY THAT SUPPORTS PARTIAL-WORD WRITE

RELATED APPLICATIONS

This is a continuation-in-part of pending U.S. patent application Ser. No. 10/997,604 filed Nov. 23, 2004, "Predictive Error Correction Code Generation Facilitating High-speed Byte-write In A Semiconductor Memory" by Wingyu Leung and Kit-Sang Tam.

The present application is related to pending U.S. patent application Ser. No. 10/645,861, "Transparent Error Correcting Memory" by Wingyu Leung, Kit-Sang Tam, Mikolaj Tworek and Fu-Chieh Hsu, which is a continuation-in-part of pending U.S. patent application Ser. No. 10/003,602, "Error Correcting Memory And Method of Operating Same" by Wingyu Leung and Fu-Chieh Hsu. The present invention is also related to U.S. Pat. No. 6,147,535, entitled "Clock Phase Generator for controlling operation of a DRAM Array" by Wingyu Leung.

FIELD OF THE INVENTION

The present invention relates to semiconductor memory systems, such as static random access memory (SRAM) systems or dynamic random access memory (DRAM) systems. In particular, the present invention relates to a method and apparatus of error detection and correction in a semiconductor memory that supports partial-word write operations.

DISCUSSION OF RELATED ART

Many semiconductor memories support partial-word (e.g., byte) write operations. A partial-word write operation allows a write operation to be performed to the memory using a quota of bits less than a word. A word is defined as the maximum number of bits that can be read or written in one memory access. A partial-word write is facilitated by partial-word write enable signals. For example, in a memory that enables 8-bit (byte) partial-word write operations within a 32-bit word, each 8-bit partial-word has an associated partial-word write enable signal which, when activated in a write transaction, allows the corresponding partial-word to be written to the memory, while the other bits in the same word are not affected.

In a semiconductor memory that does not include the circuitry required to support partial-word write operations, a partial-word write operation can be performed in the following manner. First, a full data word is read from the memory. The partial-word to be written is then merged with the read data word, outside of the memory. That is, the partial-word replaces (overwrites) the desired portion of the read data word. Subsequently, the merged data word is written to the memory. This variation of performing a partial-word write operation therefore requires both an external read transaction and an external write transaction, which are performed in a serial manner.

In a memory that supports partial-word write operations, only a memory write transaction is required, thereby cutting the required number of memory transactions in half. A memory that supports partial-word write operations also eliminates the need for a merge operation outside the memory.

Semiconductors memories such as DRAM and SRAM devices are susceptible to both soft and hard errors. Soft errors are generated when sub-atomic energetic particles hit the memory device and generate charge high enough to upset the state of one or more memory cells. Hard errors are generated by defects in the semiconductor device during the manufacturing process. The incorporation of error detection and correction circuitry in memory devices has been described in many prior art schemes.

In a memory that incorporates error correction code (ECC) protection, two different schemes are commonly employed. One scheme uses an ECC word having a width equal to the smallest quanta of the write operation plus the associated check bits. For example, in a memory that supports 8-bit partial-word write operations, an ECC word would include 8 bits of data and 4 check bits. If the memory has a word size of 32 bits, each ECC word would include 32 data bits plus 16 check bits, for a total of 48-bits. In this case, the overhead required for ECC protection is 50% of the memory capacity. This percentage is undesirably large.

If the memory does not support partial-word write operations, the required length of the ECC word can be reduced. For example, if a memory that does not support partial-word write operations has a word size of 32 bits, an ECC word would include 32 bit data plus 6 check bits, for a total of 38-bits.

In the above-described examples, the additional overhead required to support partial-word write operations in a memory that incorporates ECC protection is 10 bits (i.e., 48-bits minus 38-bits), or 26 percent. As a result, a memory that supports partial-word write operations and provides ECC protection is significantly more expensive than a memory that does not support partial-word write operations and provides ECC protection.

When a memory provides ECC protection, it may be desirable (or necessary) for the contents of the memory to be initialized before performing certain operations. In this case, each entry of the memory is written, thereby initializing the contents of the memory. Even if the initialization is performed only once after power up, this process may render the memory incompatible with other types of memory. For example, the initialization process would render this memory incompatible with a memory that does not provide ECC protection (and therefore does not require memory initialization).

It would therefore be desirable to have a memory that enables partial-word write operations, and provides ECC protection for each partial word. It would further be desirable for such a memory to be compatible with memory that supports partial-word write operations, but does not provide ECC protection.

SUMMARY

Accordingly, the present invention provides a memory device or an embedded memory block that includes an array of memory cells with built-in ECC protection. The memory supports partial-word write operations. In one embodiment, the memory cells are DRAM cells. In another embodiment, the memory cells are SRAM, FeRAM, or MRAM cells.

In accordance with the present invention, an ECC word has the same size as a memory that does not support partial-word write operations. That is, the ECC word has a width equal to the memory word size plus check bits. For example, in a memory having a word size of 32 bits, 6 check bits are used, such that the ECC word has a width of 38-bits. In this scheme, a partial-word write transaction is implemented by: (1) reading the selected ECC word (data word plus check bits) from the memory, (2) performing ECC correction on the selected data word, (3) merging the partial-word write data bits with the corrected data word, (4) generating ECC bits for the merged data word, and (5) writing the merged data word and the associated check bits to the memory. In this scheme, the partial-word write transaction is supported by a memory read operation, a data merge operation, and a memory write operation. The memory in this scheme does not require extra memory bits to support the partial-word write transaction, and the ECC protected memory does not require full-word write initialization.

In a memory where the memory cells are arranged in rows and columns with the rows designated as word lines and the columns designated as bit lines, the speed of the partial-word write transaction is increased by maintaining the selected word line and bit lines in the activated state of the read operation, so that the merged data word and associated ECC bits can be written back to the memory as soon as the ECC bits are generated. In this case, address decoding time associated with the write operation is advantageously eliminated.

The present invention will be more fully understood in view of the following description and drawings.

DETAILED DESCRIPTION

Figure 1:
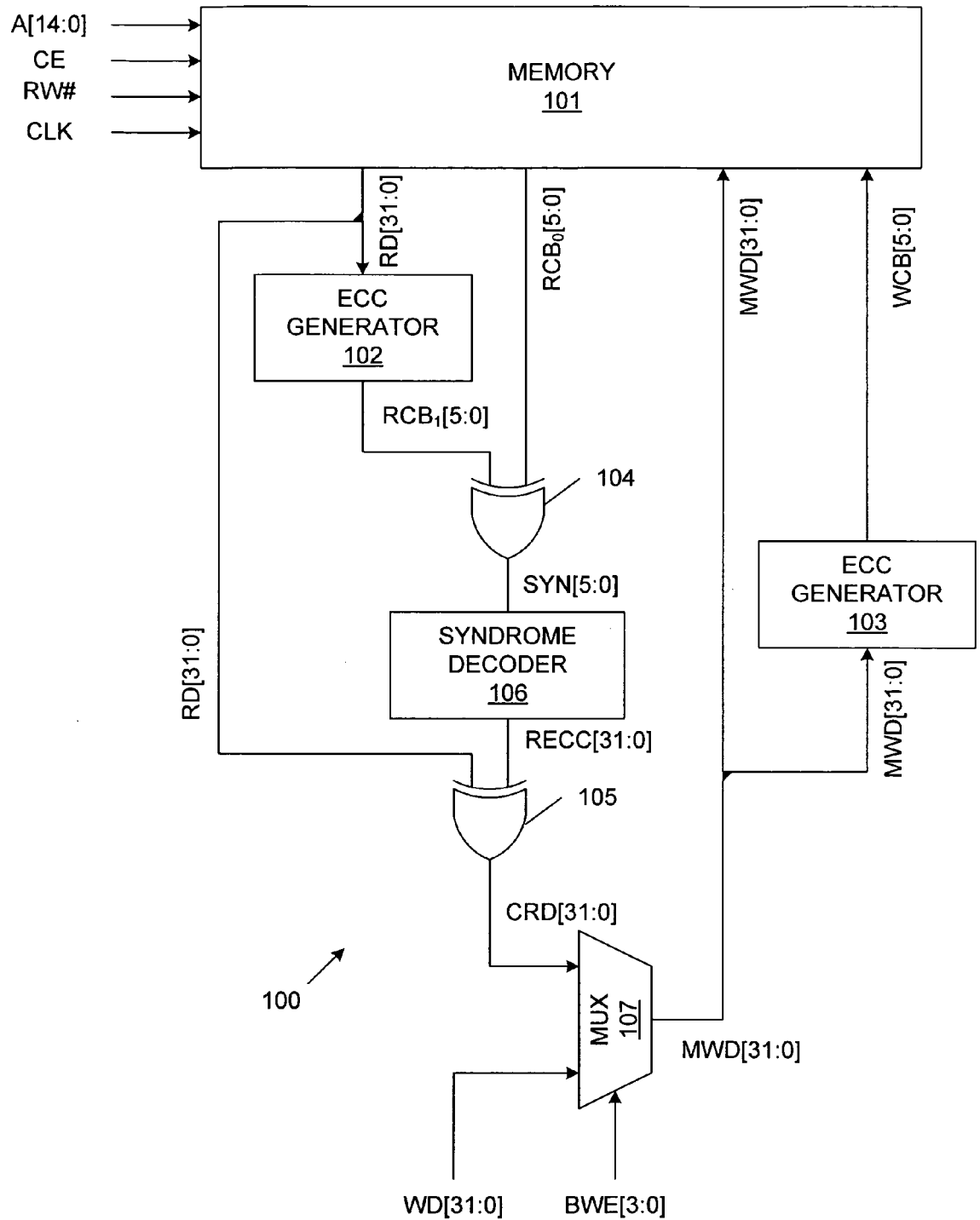
FIG. 1 is a block diagram of a memory system, which provides ECC protection and implements a read-modify-write operations to support partial-word write operations in accordance with one embodiment of the present invention.

FIG. 1 is a block diagram of a memory system 100, which provides ECC protection and implements read-modify-write operations to support partial-word write operations. Memory system 100 includes memory array 101, ECC generators 102-103, exclusive OR circuits 104-105, syndrome decoder 106 and multiplexer circuit 107. In the described embodiment, memory array 101 is organized as 32 k words of 32-bits each, and uses 6 check bits to facilitate single-bit error correction. However, other word sizes and check bit widths can be used in other embodiments.

As described in more detail below, memory system 100 supports byte-write transactions using a read-modify-write operation. Memory system 100 provides a standard interface similar to interfaces used in common synchronous SRAM systems. Thus, memory array 101 operates in response to an address signal A[14:0], a chip enable signal CE, a read/write indicator signal RW# and a clock signal CLK. Memory array 101 includes conventional circuitry associated with a semiconductor memory, such as sense-amplifiers and address decoders. In one embodiment, the memory cells of array 101 are DRAM cells. In another embodiment, the memory cells are SRAM, FeRAM, or MRAM cells.

Figure 2:
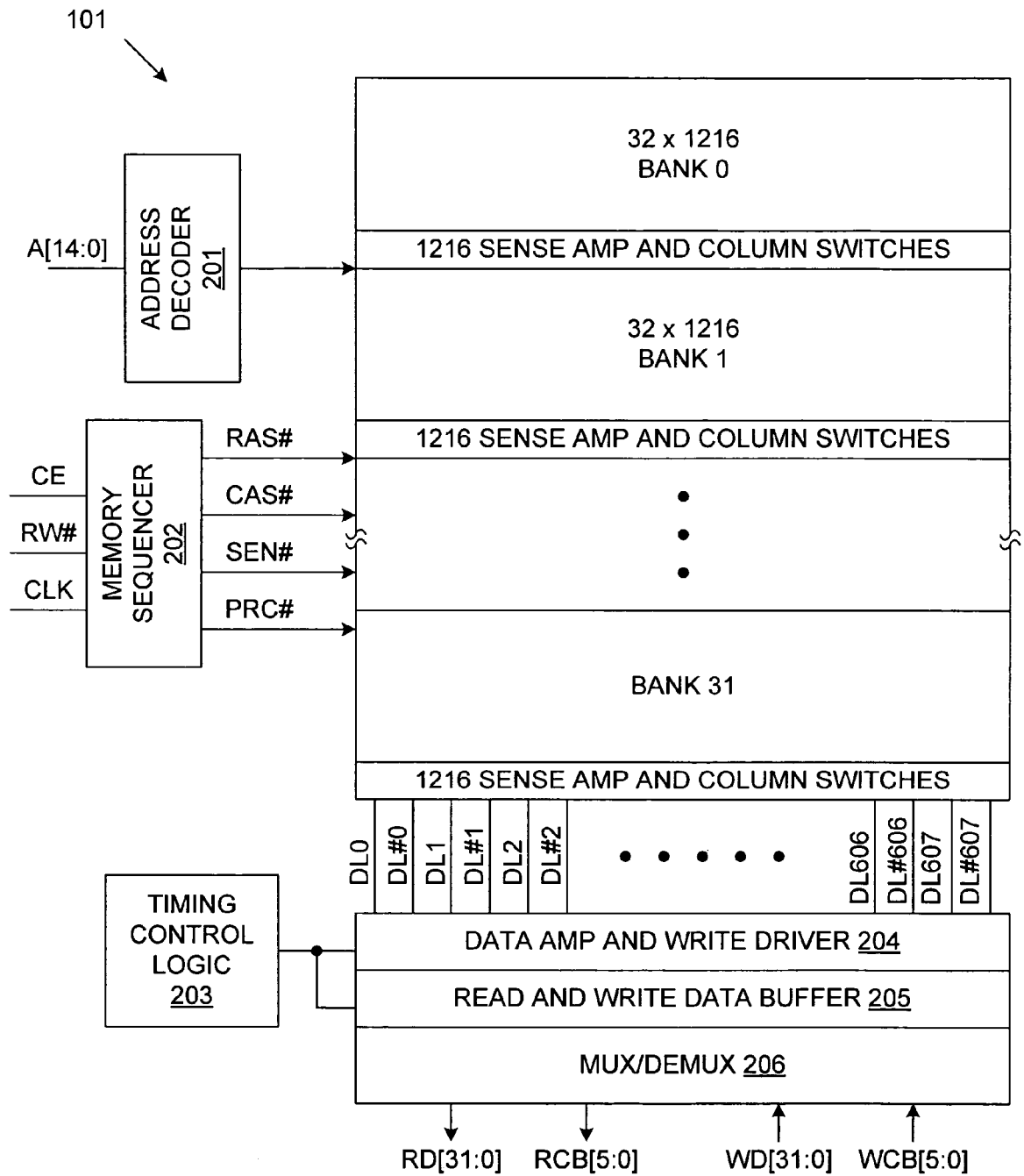
FIG. 2 is a block diagram of a portion of the memory system of FIG. 1, in accordance with one embodiment of the present invention.

FIG. 2 is a block diagram of a portion of memory array 101 in accordance with one embodiment of the present invention. Memory array 101 includes 32 memory banks (Bank 0 to Bank 31), each having an associated set of sense amplifiers and column switches. In the described embodiment, each of the memory banks includes 32 rows and 1216 columns. Each row is therefore capable of storing 32 38-bit ECC words. Other memory bank sizes/numbers can be used in other embodiments. For example, memory array 101 may include 64 rows and 608 columns in another embodiment. The small number of rows per column limits the bit line capacitance so as to maintain sufficient sensing signals when the cell capacitance is 10 femto-Farads or smaller. The memory banks are addressed by address decoder 201 in response to address signals A[14:0]. Memory sequencer 202 generates the required row access signal (RAS#), column access signal (CAS#), sense amplifier enable signal (SEN#) and pre-charge signal (PRC#) in response to the CE, RW# and CLK signals. Each of set of sense amplifiers/column switches is coupled to a common data bus, which includes lines DL[607:0] and DL#[607:0]. This data bus is coupled to data amplifier/write driver circuit 204, read/write data buffer 205 and multiplexer/de-multiplexer 206. Data amplifier/write driver 204 and read/write data buffer 205 are controlled by timing control logic 203.

In general, read data is accessed from an addressed memory bank, routed through the associated sense amplifiers and column switches, and provided to data amplifier/write driver 204. The data amplifier/write driver 204 provides the read data to read/write data buffer 205. Multiplexer/de-multiplexer 206 selectively routes a read data word RD[31:0] and read check bits RCB[5:0] from the read data stored in read/write data buffer 205. Write data is written to an addressed memory bank in the opposite direction. The specific operation of memory array 101 is described in more detail in U.S. Pat. No. 6,324,110 B1, entitled "High-Speed Read-Write Circuitry for Semiconductor Memory".

Figure 3:
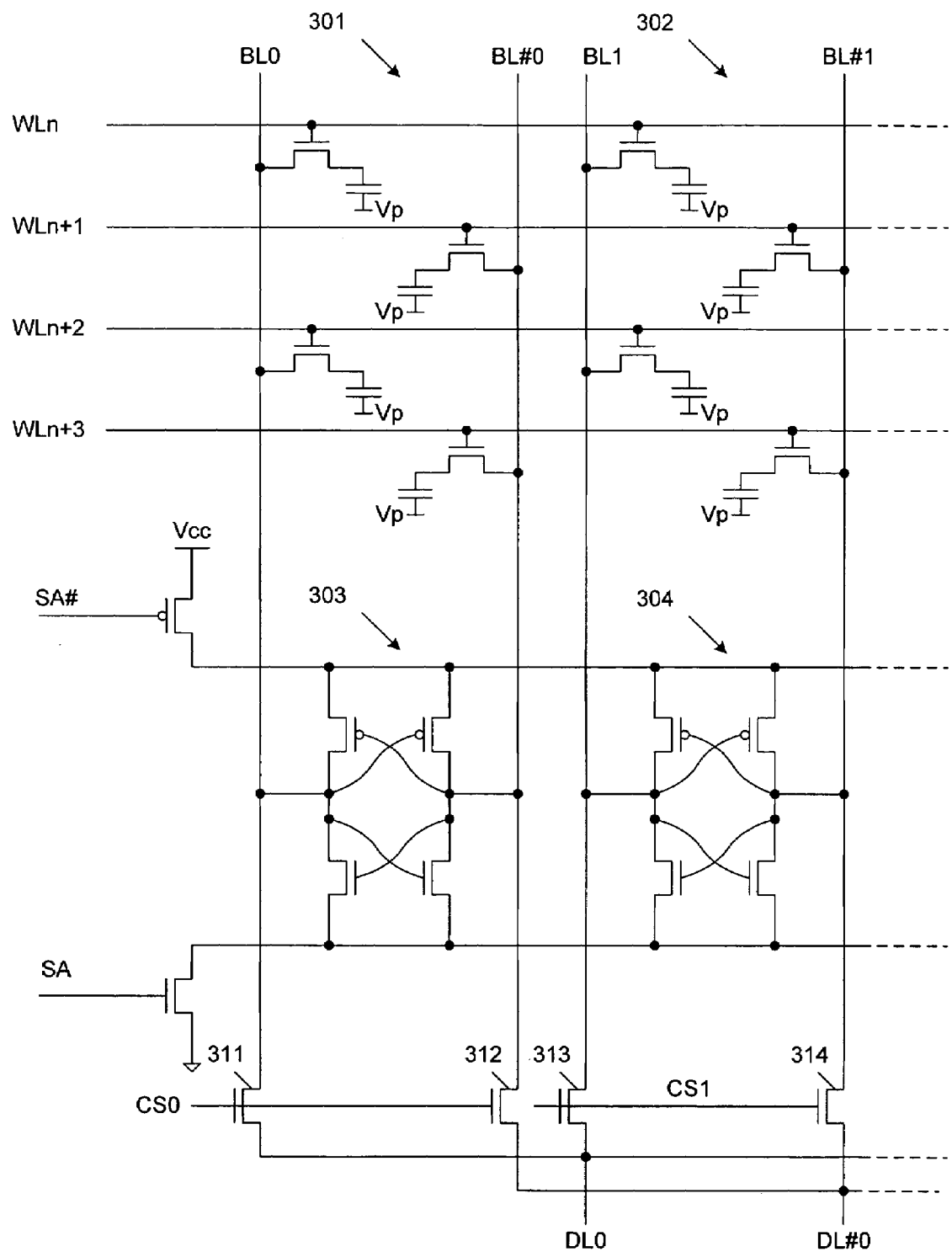
FIG. 3 is a circuit diagram illustrating the general configuration of two columns of memory cells of a memory bank of the memory system of FIG. 1, along with the associated sense amplifiers and column switches.

FIG. 3 is a circuit diagram illustrating the general configuration of two columns of DRAM memory cells 301-302 of a memory bank of array 101, along with the associated sense amplifiers 303-304 and column switches 311-314. Memory cells in the same row share a common word line (e.g., word line WLn). In general, the word lines are activated and de-activated in response to the row access signal (RAS#) generated by memory sequencer 202 (FIG. 2). Memory cells in the same column share a common pair of bit lines (e.g., BL0 and BL#0), with memory cells in the same column connected alternately to the bit lines. This configuration is commonly referred to as a folded bit line structure. Each bit line pair is coupled to a corresponding sense amplifier (e.g., sense amplifier 303), which is a regenerative latch. Each of the 1216 sense amplifiers of a memory bank are simultaneously enabled (during a read or write operation), in response to the sense amplifier enable signals SA and SA#. In general, the sense amplifiers are activated and de-activated in response to the sense amplifier enable signal (SEN#) generated by memory sequencer 202 (FIG. 2). Each bit line pair is also connected to a pair of column switches (e.g., column switches 311 and 312). The column switches are controlled by column select signals. Multiple columns are connected together and to each pair of data lines. For example, the memory cell column 301 is coupled to data lines DL0 and DL0# through column switches 311 and 312. Similarly, the memory cell column 302 is coupled to data lines DL0 and DL#0 through column switches 313 and 314. The various column switches are controlled by various column select signals (e.g., CS0 and CS1), such that the column switches perform a multiplexing function. In general, the column switches are activated and de-activated in response to the column access signal (CAS#) generated by memory sequencer 202 (FIG. 2). The data lines are coupled to data amplifier/write driver 204 as illustrated in FIG. 2.

A read-modify-write operation in accordance with the present invention will now be described. The read-modify-write operation has an associated write address A[14:0], which identifies the word location (e.g., bank, row, column) to be written. The read-modify-write operation also has associated partial-word (byte) write enable signals BWE[3:0], which indicate which of the four bytes in the addressed word location are to be written. Each of the byte write enable signals BWE[3:0], when activated high, indicates that a write operation is to be performed for the corresponding byte. For example, byte write enable signals BWE[3:0] having values of "0111" would indicate that the first, second and third bytes of the addressed word will be written, while the fourth byte of the addressed word will not be written. The byte write enable signals BWE[3:0] allow any combination of the 4 bytes in a word to be written in one write transaction.

During a read-modify-write operation, a read operation is initially performed to the specified write address in memory array 101, thereby causing a 4-byte read data word RD[31:0] and associated read check bits $RCB_0[5:0]$ to be read from memory array 101.

Figure 4:
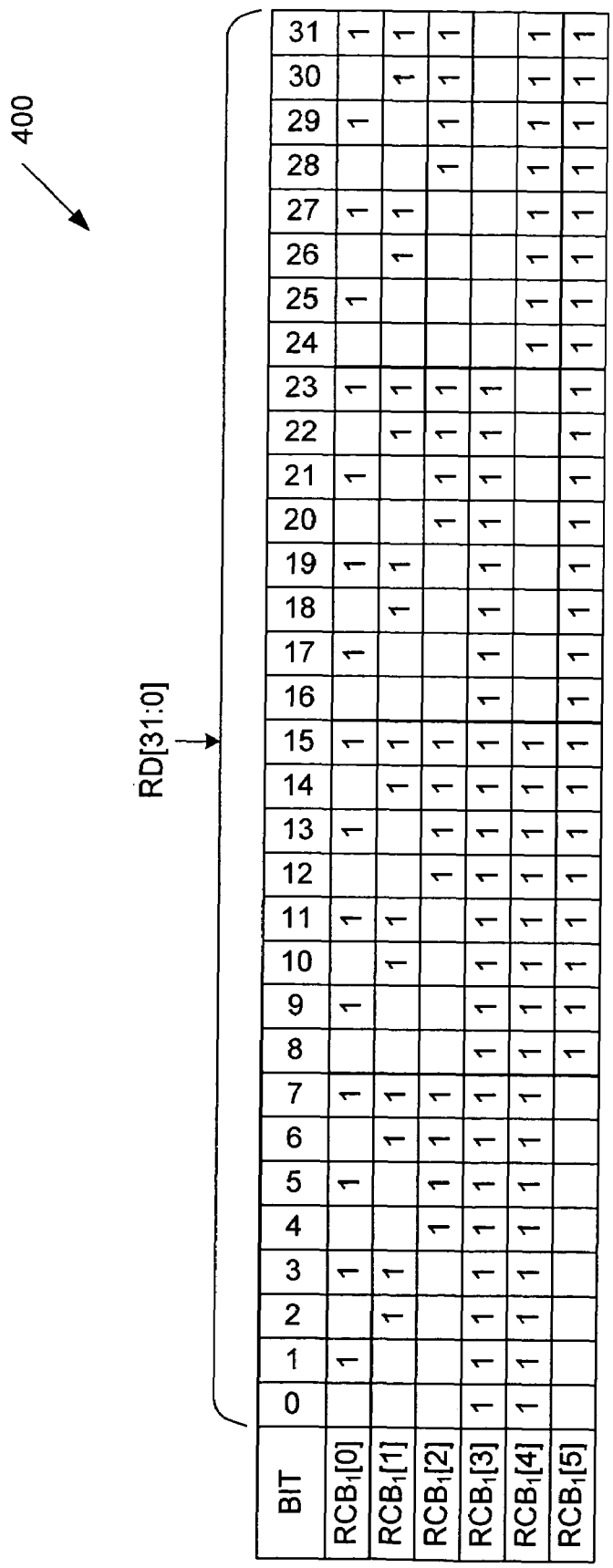
FIG. 4 is a table illustrating a modified Hamming code used to generate check bits in response to a data word, in accordance with one embodiment of the present invention.

ECC generator 102 generates a set of read check bits $RCB_1[5:0]$ in response to the received 32-bit read data word RD[31:0]. FIG. 4 is a table 400 illustrating a modified Hamming code used to generate read check bits $RCB_1[5:0]$ in response to the read data word RD[31:0], in accordance with one embodiment of the present example. As described in more detail below, the read check bits $RCB_0[5:0]$ are originally generated using the same modified Hamming code illustrated in table 400. Columns 0 to 31 of table 400 show the ECC code for the corresponding bits of the read data word RD[31:0]. Rows 0 to 5 shows the parity generation of the corresponding read check bits $RCB_1[5:0]$. More specifically, each read check bit $RCB_1[n]$ is generated by performing an exclusive OR operation on the bits identified by table 400.

In the described embodiment, ECC generator 102 incorporates 3-levels of exclusive OR logic gates. The exclusive-OR tree implementation of modified Hamming code is well understood in the field of error correction codes and therefore is not further elaborated. The described modified Hamming code allows for single-bit error correction. Other ECC codes can be used in other embodiments.

Read check bit values $RCB_0[5:0]$ and $RCB_1[5:0]$ are provided to exclusive OR circuit 104. In response, exclusive OR circuit 104 performs a bit-wise comparison of the two read check bit values $RCB_0[5:0]$ and $RCB_1[5:0]$ using six 2-input exclusive OR gates (not shown). For example, if read check bit $RCB_0[0]$ matches read check bit $RCB_1[0]$, then exclusive OR circuit 104 will provide a corresponding syndrome bit SYN[0] having a logic "0" value. Thus, as long as the read check bits $RCB_0[5:0]$ match the read check bits $RCB_1[5:0]$, the syndrome word SYN[5:0] will have all logic "0" values (i.e., "000000")

Conversely, if read check bit $RCB_0[0]$ does not match read check bit $RCB_1[0]$, then exclusive OR circuit 104 will provide a corresponding syndrome bit SYN[0] having a logic "1" value. In the described modified Hamming code, the syndrome bits SYN[5:3] identify the byte in which a single bit error exists (i.e., "011", "111", "101" and "110" identify single bit errors in bytes RD[7:0] RD[15:8] RD[23:16] and RD[31:24], respectively.)

The syndrome bits SYN[2:0] identify the location of the error bit within the read data word identified by the syndrome bits SYN[5:3]. For example, if syndrome bits SYN[5:3] have a value of "111" and syndrome bits SYN[2:0] have a value of "010", a single bit error exists in read data bit RD[10] (i.e., bit location [2] of byte[1]). In this manner, exclusive OR circuit 104 provides the syndrome word SYN[5:0].

Syndrome decoder 106 decodes the syndrome word SYN[5:0], thereby providing read error correction code RECC[31:0]. In the described embodiment, syndrome decoder 106 is a 6-to-32 decoder implemented using two levels of AND gates (not shown). This type of implementation using combinatorial logic is well known in the art of logic design and therefore is not described further. If there is a single-bit error associated with the read data word RD[31:0], the read error correction code RECC[31:0] provided by the 32-bit syndrome decoder 107 will exhibit a logic '1' bit that identifies the location of the single-bit error in the read data value RD[31:0]. If there is no error associated with the read data word RD[31:0], then both the syndrome word SYN[5:0] and the read error correction code RECC[31:0] will have all logic "0" bits. The read data value RD[31:0] and the read error correction code RECC[31:0] are applied to exclusive OR circuit 105, thereby creating corrected read data word CRD[31:0].

The corrected read data word CRD[31:0] and the current write data word WD[31:0] are applied to multiplexer circuit 107. The byte write enable signals BWE[3:0], which identify which of the four bytes in the write data word WD[31:0] are actually being written to memory array 101, are applied to the control terminals of multiplexer 107.

Figure 5:
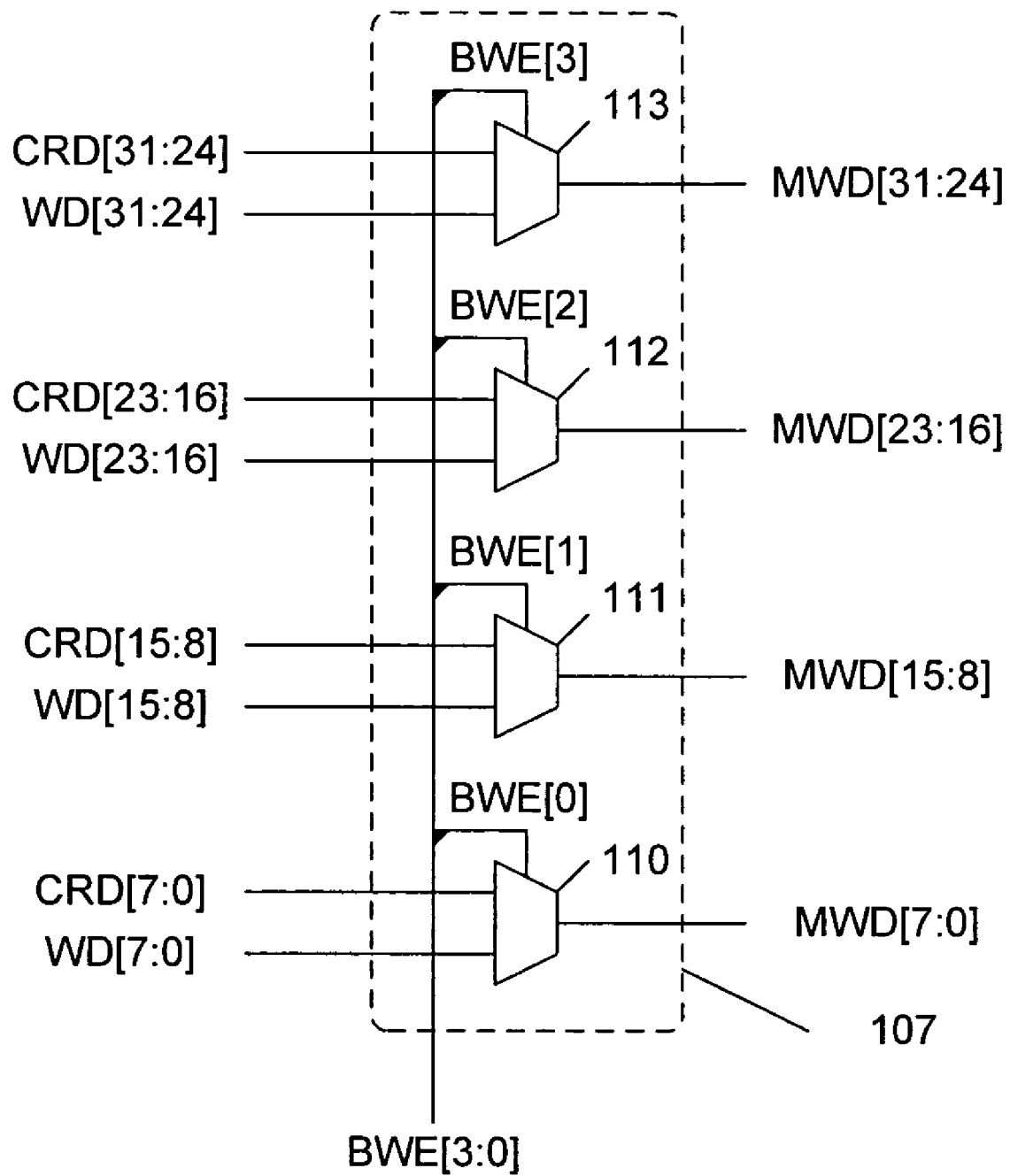
FIG. 5 is a block diagram illustrating a multiplexer circuit present in the memory system of FIG. 1, in accordance with one embodiment of the present invention.

FIG. 5 is a block diagram illustrating multiplexer circuit 107 in more detail. Multiplexer circuit 107 includes multiplexers 110, 111, 112 and 113, which are controlled by byte write enable signals BWE[0], BWE[2], BWE[2] and BWE[3], respectively. Multiplexers 110, 111, 112 and 113 are coupled to receive write data bytes WD[7:0], WD[15:8], WD[23:16] and WD[31:24], respectively, and corrected read data bytes CRD[7:0], CRD[15:8], CRD[23:16] and CRD[31:24], respectively. Multiplexers 110, 111, 112 and 113 provide merged write data bytes MWD[7:0], MWD[15:8], MWD[23:16] and MWD[31:24], respectively. During a read-modify-write operation, up to four bytes of the corrected read data word CRD[31:0] can be replaced with the corresponding bytes of the write data word WD[31:0], thereby creating the merged write data word MWD[31:0].

More specifically, if a byte write enable signal BWE[n] has a logic "1" value, then the associated write data byte WD is routed by multiplexer circuit 107. Conversely, if a byte write enable signal BWE[n] has a logic "0" value, then the associated corrected read data byte CRD is routed by multiplexer circuit 107.

In the case where all bits of the byte write enable signal BWE[3:0] have a logic "0" value, only the corrected read data word CRD[31:0] is written to memory array 101, and the write data word WD[31:0] is ignored. This can be advantageously used to facilitate memory scrubbing. During memory scrubbing, write accesses are performed to all of the memory locations of memory array 101, with the byte write enable signal BWE[3:0] set to a value of "0000". In this manner, all single bit errors in memory array 101 are corrected.

The merged write data word MWD[31:0] is provided to ECC generator 103, thereby generating a new set of check bits WCB[5:0] associated with the merged write data word MWD[31:0]. ECC generator 103 uses the same modified Hamming code as ECC generator 102. The new ECC word, which includes the merged write data value MWD[31:0] and the new write check bits WCB[5:0] is written to memory array 101, thereby completing the read-modify-write operation. Note that single-bit errors in the read data word RD[31:0] are corrected during the read-modify-write operation.

It is also important to note that the present invention does not require the contents of memory array 101 to be initialized prior to performing a read-modify-write operation. This is because the read check bits associated with the read operation are not used during the write operation. That is, the write check bits are generated solely in response to the merged write data word. Thus, the initial read check bits read from the memory are not used during the subsequent generation of the write check bits. Advantageously, this renders memory system 100 compatible with memory that supports partial-word write operations, but does not provide ECC protection, thus making the ECC operations transparent.

During the read-modify-write process of the present invention, the selected word line, sense amplifiers and data amplifiers of the accessed memory bank remain activated during the entire read-modify-write operation, until the merged write data word MWD[31:0] and write check bits WCB[5:0] have been written to memory array 101. In a particular embodiment, the selected column switches of the accessed memory bank also remain activated during the entire read-modify-write access cycle.

In an alternate embodiment, the selected column switches are turned on twice during the read-modify-write operation. More specifically, the selected column switches are turned on a first time during the read operation, after the sense amplifiers have completed data sensing. The activated column switches route the data stored by the sense amplifiers in the selected memory bank to the associated data lines DL[607:0]-DL#[607:0]. When sufficient signal strength has been developed on these data lines, the data amplifier/write driver circuit 204 and read/write data buffers 205 (FIG. 2) are activated, thereby driving the addressed read data word RD[31:0] and read check bits RCB[5:0] out of memory array 101. The column switches are turned off after the data amplifier/write buffer circuit 204 is activated.

The merged write data word MWD[31:0] and write check bits WCB[5:0] are subsequently generated in the manner described above, and are provided to data amplifier/write driver circuit 204 via multiplexer/demultiplexer 206 and read/write data buffer 205 (FIG. 2). Data amplifier/write driver circuit 204 drive the merged write data word MWD[31:0] and write check bits WCB[5:0] onto data lines DL[607:0] and DL#[607:0]. The selected column switches are then re-activated (turned on), thereby coupling the merged write data word and write check bits to the associated sense amplifiers. The merged write data word and write check bits are routed from the sense amplifiers to the bit lines, and eventually the selected memory cells. After the merged write data word and write check bits are stored in the memory cells, the column switches are turned off. The word lines and sense amplifiers are subsequently turned off. Turning the column switches off between the read and write operations saves power by decoupling the sense amplifiers from the heavily loaded data lines.

Figure 6:
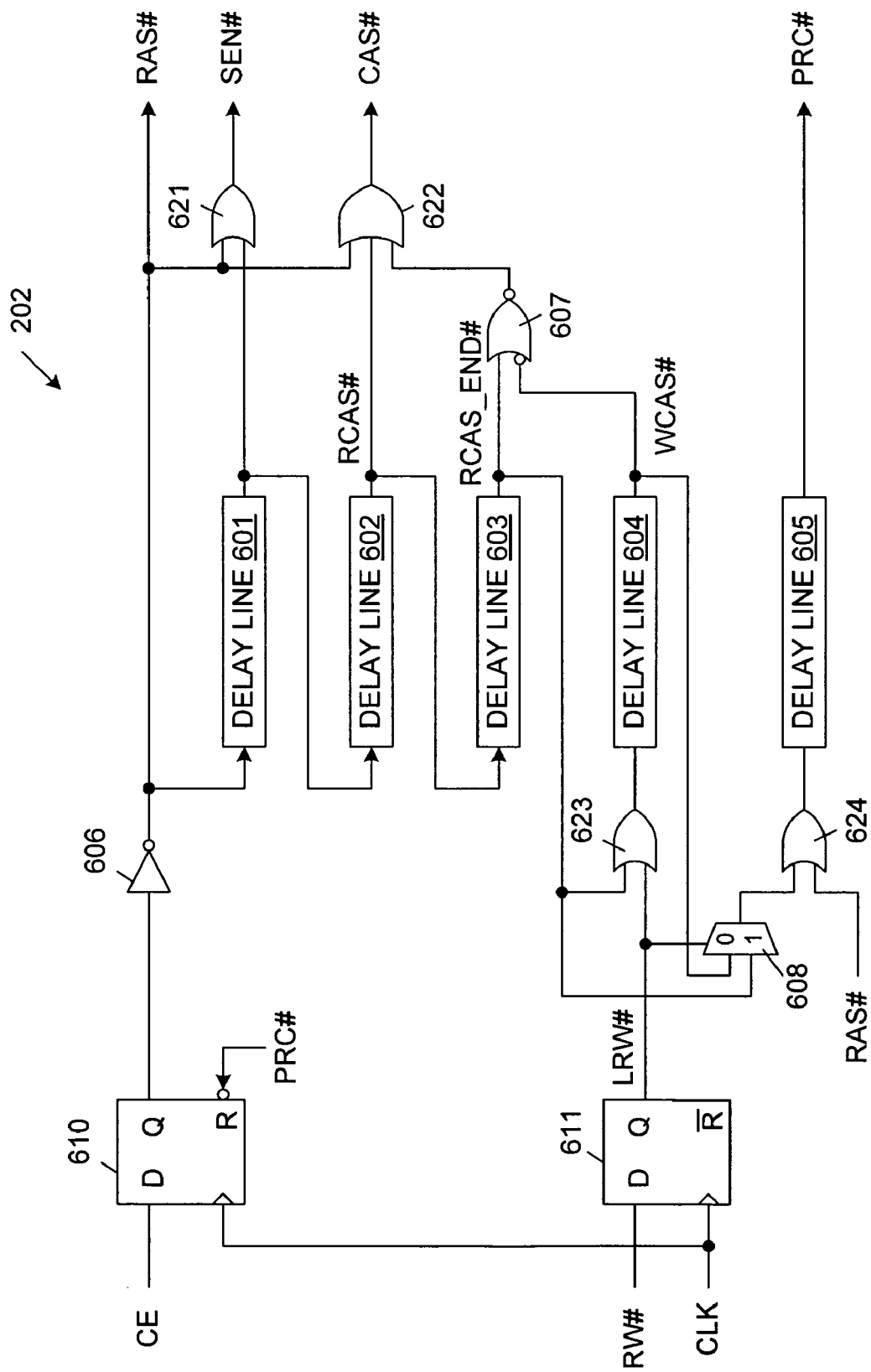
FIG. 6 is a circuit diagram of a memory sequencer which generates signals for controlling the operation of the memory system of FIG. 1 in accordance with one embodiment of the present invention.

FIG. 6 is a circuit diagram of memory sequencer 202, which generates the RAS#, SEN#, CAS# and PRC# signals for controlling the operation of memory array 101 in accordance with one embodiment of the present invention. The RAS#, SEN#, CAS# and PRC# signals are conventional signals for controlling a DRAM array. The functionality of these signals is understood by those of ordinary skill in the art. For example, the functionality of these control signals is described in detail in U.S. Pat. No. 6,078,547, "Method and Structure for Controlling Operation of a DRAM Array".

Memory sequencer 202 includes delay lines 601-605, inverter 606, NOR gate 607, multiplexer 608, D-Q flip-flops 610-611, and OR gates 621-624, which are connected as illustrated in FIG. 6.

Figure 7:
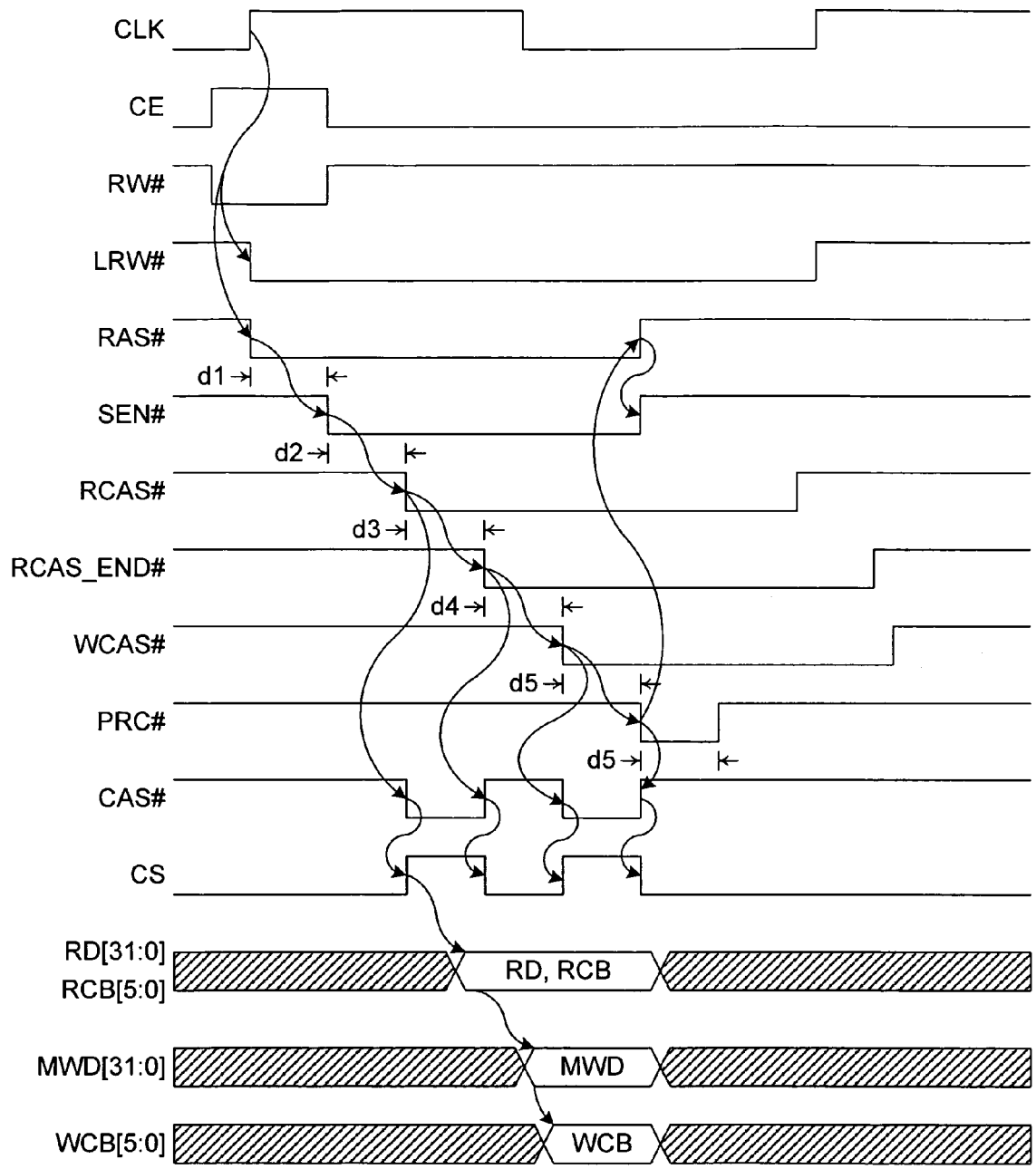
FIG. 7 is a waveform diagram of memory control signals and data signals generated during a read-modify-write cycle in accordance with one embodiment of the present invention.

FIG. 7 is a waveform diagram of the memory control signals and the data signals generated during a read-modify-write cycle in accordance with one embodiment of the present invention.

The operation of memory sequencer 202 during a read-modify-write cycle will now be described. In the described embodiment, a read-modify-write operation is performed each time that a write operation is requested. The chip enable signal CE is activated high and the read/write signal RW# is de-activated low to begin a read-modify-write operation. The next rising edge of the clock signal CLK causes the logic high chip enable signal CE and the logic low read/write signal RW# to be latched into flip-flops 610 and 611, respectively. As a result, flip-flop 610 provides a logic high output value Q to inverter 606. In response, inverter 606 activates the row access signal RAS# to a logic low state. An addressed word line in an addressed memory bank is turned on in response to the activated RAS# signal.

The logic low RAS# signal is applied to delay line 601. After a first predefined delay period (d1), delay line 601 provides a logic low output signal, which is applied to OR gate 621 (along with the logic low RAS# signal). In response, OR gate 621 drives the sense amplifier enable signal SEN# to a logic low state. The sense amplifiers in the addressed memory bank are turned on in response to the activated SEN# signal.

The logic low sense amplifier enable signal SEN# is also applied to delay line 602. After a second predefined delay period (d2), delay line 602 provides a logic low read column access signal RCAS#, which is applied to OR gate 622 (along with the logic low RAS# signal and the output of NOR gate 607). At this time, the output of NOR gate 607 has a logic low state (because the RCAS_END# signal, described below, has a logic high state). Because all three inputs to NOR gate 607 are low, the column access signal CAS# is driven to a logic low state (i.e., activated). The addressed column switches in the addressed memory bank are turned on in response to the activated (low) state of the CAS# signal. This is illustrated in FIG. 7 by the logic high column switch signal CS. The activated column switches cause the addressed read data word RD[31:0] and the read check bits RCB[5:0] to be read from memory array 101. The read data word RD[31:0] is corrected, and the merged write data value MWD[31:0] and write check bits WCB[5:0] are generated in the manner described above.

The logic low read column access signal RCAS# is also applied to delay line 603. After a third predefined delay period (d3), delay line 603 provides a read column access end signal RCAS_END# having a logic low state. The RCAS_END# signal is applied to an input terminal of NOR gate 607. An inverting input terminal of NOR gate 607 is coupled to receive a write column access signal WCAS# (described below), which initially has a logic high state. When the RCAS_END# signal transitions to a logic low state, NOR gate 607 provides a logic high signal to OR gate 622, thereby causing the CAS# signal to be deactivated to a logic high state. In response, the column switch signal CS is de-activated low, thereby turning off the column switches. Note that in an alternate embodiment, the CAS# signal may remain activated low, and the column switches may remain on between the read and write operations of the read-modify-write operation.

The logic low RCAS_END# signal is also applied to delay line 604. After a fourth predefined delay period (d4), delay line 604 provides a write column access signal WCAS# having a logic low state. In response, NOR gate 607 provides a logic low signal to OR gate 622, thereby causing the CAS# signal to be re-activated to a logic low state (and the column switch signal CS to be re-activated to a logic high state). In response, the addressed column switches in the addressed memory bank are turned on, allowing the merged write data word MWD[31:0] and write check bits WCB[5:0] to be written to the addressed row of the addressed memory bank.

The logic low write column access signal WCAS# is routed through multiplexer 608 (in response to the logic low state of the latched read/write signal LRW#) to OR gate 624. OR gate also receives the RAS# signal, which has a logic low state at this time. In response, OR gate 624 provides a logic low signal to delay line 605. After a fifth predefined delay period (d5), delay line 605 provides a pre-charge signal PRC# having a logic low (activated) state. The activated (low) pre-charge signal PRC# initiates a bit line pre-charge operation within the addressed memory bank.

The logic low PRC# signal also resets flip-flop 610, such that the Q output of this flip-flop has a logic low state. In response, inverter 606 drives the RAS# signal to a logic high state, thereby deactivating the RAS# signal. The logic high state of the RAS# signal, which is applied to input terminals of OR gates 621 and 622, causes the sense amplifier enable signal SEN# and the column access signal CAS# to be deactivated to logic high states.

The logic high state of the RAS# signal, which is applied to an input terminal of OR gate 624, also causes a logic high signal to be applied to the input of delay line 605. Consequently, after a delay period of d5, the PRC# signal is deactivated to a logic high state. The logic high RAS# signal propagates through delay lines 601-604 in time to properly prepare for the next memory access operation. The various delay periods d1-d5 are selected to accomplish the above recited operations.

Figure 8:
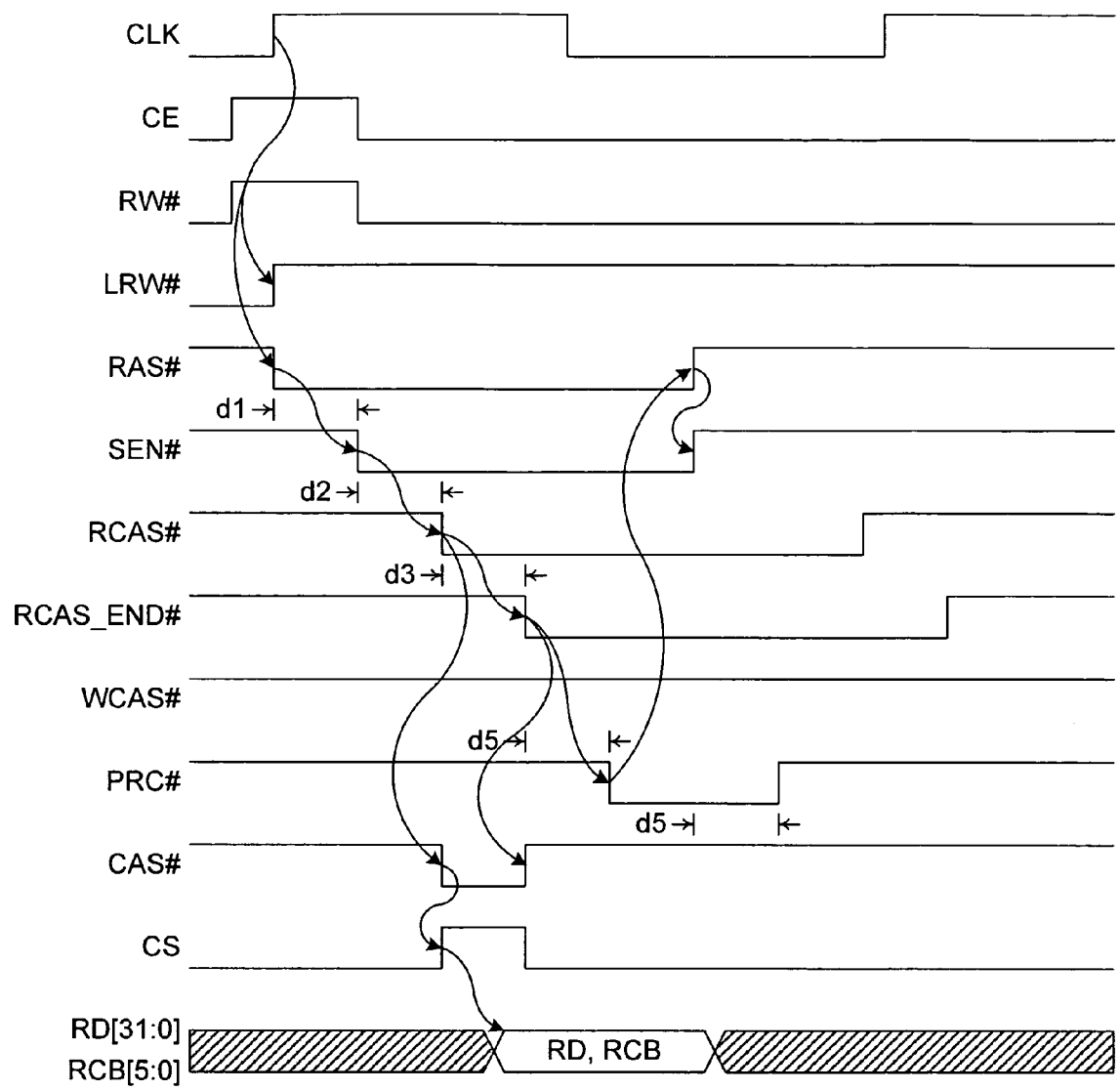
FIG. 8 is a waveform diagram of memory control signals and data signals generated during a read cycle in accordance with one embodiment of the present invention.

As described above, the read operation performed during a read-modify-write operation includes address decoding and data amplification, while the write operation performed during the read-modify-write operation includes bit line pre-charge time. Both data amplification and bit line pre-charge are common techniques used in high-speed memory design. However, in the described embodiment, the memory read time does not include word line turn off and bit line pre-charge time typically associated with a read access operation (FIG. 8). Instead, both the word line and the sense amplifiers remain activated after the read operation, and are not subsequently deactivated until after the write operation is complete. Consequently, the write operation does not include address decoding time or data sensing time, both of which are typically incurred when a write operation is performed as a stand alone operation. Therefore, the read-modify-write operation of the present embodiment saves a significant portion of the memory cycle time, which includes address decoding, word line activation, data sensing and bit line pre-charge.

FIG. 8 is a waveform diagram illustrating the manner in which memory sequencer 202 carries out a read access operation. The CE and RW# signals are both activated to a logic high state. These signals (CE and RW#) are latched into flip-flops 610 and 611 in response to the next rising edge of the CLK signal. The RAS#, SEN#, RCAS#, RCAS_END# and CAS# signals are generated in the manner described above, by propagation of the low RAS# signal through delay lines 601-603. During a read access operation, the latched read/write signal LRW# has a logic high state, which causes the write column access signal WCAS# to remain in a logic high state throughout the read access operation. As a result, when the RCAS_END# signal transitions to a logic low state, the CAS# signal is deactivated high, and is not re-activated for the remainder of the read access operation. Note that the column switches are also not reactivated during the read access operation.

Multiplexer 608 routes the RCAS_END# signal to OR gate 624 in response to the logic high state of the latched read/write signal LRW#. Thus, the RCAS_END# signal effectively propagates through delay line 605 (with delay period d5) to activate the pre-charge signal PRC#. The RAS#, SEN# and PRC# signals are de-activated high in the manner described above in the read-modify write operation.

Although the invention has been described in connection with several embodiments, it is understood that this invention is not limited to the embodiments disclosed, but is capable of various modifications, which would be apparent to a person skilled in the art. For example, although the described embodiments have focused on a memory array using DRAM or SRAM cells, it is understood that a memory array using non-volatile memory cells can be implemented with minor modification. Such modification could be readily accomplished by one of ordinary skill in the art of memory design. Thus, the invention is limited only by the following claims.

I claim:

1. A memory system comprising:

a memory array including a plurality of memory cells arranged in rows and columns, a plurality of word lines coupled to corresponding rows of memory cells, a plurality of bit lines coupled to corresponding columns of memory cells, a plurality of sense amplifiers coupled to the bit lines, and a plurality of column switches coupled to the sense amplifiers, wherein the memory cells are configured to store a plurality of error correction code (ECC) words, each including a data value and associated error correction bits;

a data bus, wherein the column switches are coupled between the data bus and the sense amplifiers;

a memory interface coupled to the data bus, wherein the memory interface is configured to support a partial word write operation to the memory array by implementing a read operation from the memory array followed by a write operation to the memory array; and a memory sequencer configured to continuously activate the word line and sense amplifiers during the read and write operations of the partial word write operation.

2. The memory system of claim 1, wherein the memory sequencer is further configured to continuously activate the column switches during the read and write operations of the partial word write operation.

3. The memory system of claim 1, wherein the memory interface comprises:

means for correcting a data value read from the memory array in response to the associated error correction bits, whereby a corrected data value is generated;

means for merging the corrected data value with a write data value, thereby creating a merged write data value;

means for generating write error correction bits in response to the merged write data value; and means for providing the merged write data value and write error correction bits to the data bus.

4. The memory system of claim 1, wherein the memory sequencer is further configured to activate the column switches during the read operation and during the write operation of the partial word write operation, and deactivate the column switches between the read operation and the write operation of the partial word write operation.

5. The memory system of claim 4, wherein the memory sequencer comprises a plurality of delay lines that transmit control signals used to activate and deactivate the column switches.

6. The memory system of claim 1, wherein the memory array comprises a plurality of memory banks, each having a corresponding set of sense amplifiers and column switches.

7. The memory system of claim 6, wherein each of the memory banks comprises 64 rows of memory cells or less.

8. A method of performing a partial-word write operation in a memory system, comprising:

reading an error correction code (ECC) word, which includes a data word and associated error correction bits, from a memory array, wherein a word line and a plurality of sense amplifiers are enabled during this step;

correcting the data word in response to the associated error correction bits, thereby creating a corrected data word;

merging the corrected data word with a write data word, thereby creating a merged write data word;

generating write error correction bits in response to the merged write data word;

writing the merged write data word and the write error correction bits to the memory array, wherein the word line and the plurality of sense amplifiers remain enabled from the reading step through the writing step.

9. The method of claim 8, further comprising continuously activating a plurality of column switches in the memory array during the reading and writing steps.

10. The method of claim 8, further comprising completing the reading step and the writing step during a single clock cycle.

11. The method of claim 8, further comprising activating one memory bank of a plurality of memory banks during the reading and writing steps.

12. The method of claim 8, further comprising:

activating a plurality of column switches in the memory array during the reading step;

activating the plurality of column switches in the memory array during the writing step; and deactivating the plurality of column switches in the memory array between the reading step and the writing step.

13. The method of claim 12, further comprising activating and deactivating the plurality of column switches in response to a plurality of delay lines.

* * * * *